United States Patent
Yen et al.

(10) Patent No.: US 10,077,187 B2
(45) Date of Patent: Sep. 18, 2018

(54) SEMICONDUCTOR STRUCTURE AND MANUFACTURING METHOD THEREOF

(71) Applicant: TAIWAN SEMICONDUCTOR MANUFACTURING COMPANY LTD., Hsinchu (TW)

(72) Inventors: Li-Chen Yen, Hsinchu (TW); Yi-Hsien Chang, Changhua County (TW); Chun-Ren Cheng, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 46 days.

(21) Appl. No.: 15/014,871

(22) Filed: Feb. 3, 2016

(65) Prior Publication Data

US 2017/0217769 A1    Aug. 3, 2017

(51) Int. Cl.
*H01L 21/78* (2006.01)
*B81C 1/00* (2006.01)
*H01L 23/544* (2006.01)

(52) U.S. Cl.
CPC ...... *B81C 1/00825* (2013.01); *B81C 1/00182* (2013.01); *H01L 21/78* (2013.01); *H01L 23/544* (2013.01); *B81C 2203/0785* (2013.01); *H01L 2223/5446* (2013.01)

(58) Field of Classification Search
CPC .............................. H01L 21/78; H01L 23/544
See application file for complete search history.

(56) References Cited

U.S. PATENT DOCUMENTS

| | | | | |
|---|---|---|---|---|
| 2005/0037534 A1* | 2/2005 | Sawyer | ................. | B81B 7/0048 438/84 |
| 2012/0267780 A1* | 10/2012 | Chen | ...................... | H01L 21/78 257/737 |
| 2013/0043510 A1* | 2/2013 | Shu | ...................... | B81C 1/00269 257/254 |
| 2014/0239353 A1* | 8/2014 | Daneman | ............ | B81C 1/00158 257/254 |
| 2015/0298968 A1* | 10/2015 | Lushan | ............... | B81C 1/00269 257/415 |
| 2016/0083248 A1* | 3/2016 | Xu | .................. | H01L 21/823437 257/415 |
| 2016/0107881 A1* | 4/2016 | Thompson | ............ | B81B 7/0064 257/418 |
| 2016/0164490 A1* | 6/2016 | Kamijo | ................. | H03H 9/0509 310/348 |

\* cited by examiner

*Primary Examiner* — Joseph Galvin, III
(74) *Attorney, Agent, or Firm* — WPAT, P.C., Intellectual Property Attorneys; Anthony King

(57) ABSTRACT

A semiconductor manufacturing method includes providing a wafer. A layer is formed over a surface of the wafer where the layer is able to form a eutectic layer with a conductive element. The layer is partially removed so as to form a plurality of mesas. The wafer is bonded to a substrate through the plurality of mesas. The substrate is thinned down to a thickness so as to be less than a predetermined value.

20 Claims, 23 Drawing Sheets

SEMICONDUCTOR STRUCTURE AND MANUFACTURING METHOD THEREOF

BACKGROUND

Electronic equipment involving semiconductive devices are essential for many modern applications. Technological advances in materials and design have produced generations of semiconductive devices where each generation has smaller and more complex circuits than the previous generation. In the course of advancement and innovation, functional density (i.e., the number of interconnected devices per chip area) has generally increased while geometric size (i.e., the smallest component that can be created using a fabrication process) has decreased. Such advances have increased the complexity of processing and manufacturing semiconductive devices.

Micro-electro mechanical system (MEMS) devices have been recently developed and are also commonly involved in electronic equipment. The MEMS device is a micro-sized device, usually in a range from less than 1 micron to several millimeters in size. The MEMS device includes fabrication using semiconductive materials to form mechanical and electrical features. The MEMS device may include a number of elements (e.g., stationary or movable elements) for achieving electro-mechanical functionality. For many applications, the MEMS device is electrically connected to external circuitry in order to form complete MEMS systems. Commonly, the connections are formed by wire bonding. MEMS devices are widely used in various applications. MEMS applications include gas detectors, pressure sensors, printer nozzles, or the like. Moreover, MEMS applications are extended to optical applications, such as movable mirrors, and radio frequency (RF) applications, such as RF switches or the like.

As technologies evolve, designs for devices become more complicated in view of smaller dimensions and an increase of functionality and the amount of circuitries. Numerous manufacturing operations are implemented within such a small and high performance semiconductor device. The manufacturing of the semiconductor device in a miniaturized scale becomes more complicated, and the increase in complexity of manufacturing may cause deficiencies such as high yield loss, poor reliability of the electrical interconnection, warpage and other problems. Therefore, there is a continuous need to modify the structure and manufacturing method of the devices in the electronic equipment in order to improve the device performance as well as reduce manufacturing cost and processing time.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
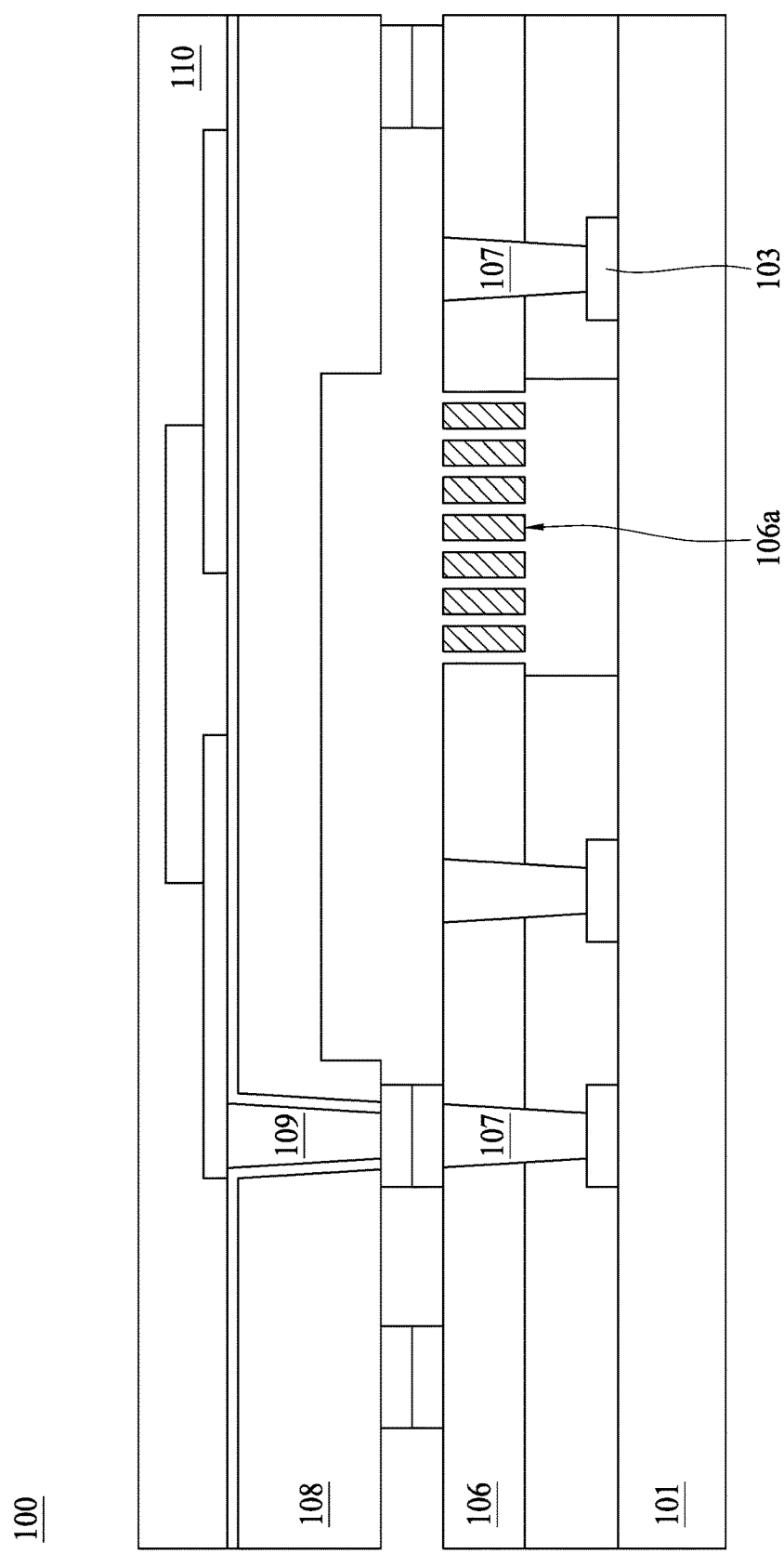
FIG. 1 is a schematic view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An electronic equipment can include multiple MEMS sensors, and those sensors can be integrated onto a semiconductive chip in recent generations of MEMS applications. For example, motion or inertial sensors are used for motion-activated user interfaces in consumer electronics such as smartphones, tablets, gaming consoles, and automotive crash detection systems. To capture a complete range of movement within a three-dimensional space, motion sensors often utilize an accelerometer in combination with a gyroscope. The accelerometer detects linear movement, and the gyroscope detects angular movement. In addition, a magnetic sensor, such as an electronic compass, is also integrated onto the chip for navigation. The magnetic sensor can determine a direction of an external magnetic field. To meet consumer demand for low cost, high quality, and small device footprint, multiple sensors are integrated together on a same substrate.

The MEMS sensors are fabricated and integrated on the substrate by various processes. The processes usually start from a wafer and incorporate several different operations before singulation. The wafer may have a thickness at least greater than 600 um in order to have enough rigidity while traveling between the operations. However, as the electronic equipment becomes more compact and multi-functional, a final singulated MEMS sensor is required to be complex and thin.

The present disclosure is directed to provide an ultra-thin semiconductor structure including multiple devices that are integrated on a substrate. The semiconductor structure includes at least a MEMS sensor built in/on a substrate and has a thickness below 100 um. In some embodiments, the semiconductor structure includes a substrate and one or more devices disposed over the substrate and integrated by several conductive vias. The integration of the devices by the conductive vias allows stacking of the devices over each other on the substrate in order to reduce a geometric size or form factor of the semiconductor structure. Further, some embodiments can be fabricated after completion of high temperature processes, such as wafer bonding operations. The present disclosure also provides a method of thinning down a wafer carrying MEMS sensors to a thickness of at least under 200 um, or even under 50 um or 100 um.

FIG. 1 is a schematic cross-sectional view of a semiconductor structure 100 in accordance with some embodiments of the present disclosure. Semiconductor structure 100 is configured for sensing various characteristics such as motion, movement, magnetic field, pressure or combination thereof. In some embodiments, semiconductor structure 100 is configured for sensing linear motion, angular motion, and a direction of a magnetic field. In some embodiments, semiconductor structure 100 includes one or more substrates stacking over each other and one or more devices for sensing various predetermined characteristics. Semiconductor structure 100 includes a first substrate 101, a second substrate 106, a third substrate 108, a first device 106a and a second device 110. It should be appreciated that semiconductor structure 100 may include one or more substrates and one or more devices.

First substrate 101 includes several circuitries and active elements, such as transistors, disposed over or in first substrate 101. In accordance with some embodiments, the circuitries may include various n-type metal-oxide semiconductor (NMOS) and/or p-type metal-oxide semiconductor (PMOS) devices, such as transistors, capacitors, resistors, diodes, photo-diodes, fuses and/or the like. The circuitries may be interconnected to perform one or more functions. In some embodiments, first substrate 101 includes ASIC components disposed over or in first substrate 101. In some embodiments, first substrate 101 includes CMOS components disposed over or in first substrate 101. In some embodiments, first substrate 101 includes semiconductive materials, such as silicon or other suitable materials.

Second substrate 106 is disposed over first substrate 101. Second substrate 106 may be vertically stacked over first substrate 101. In some embodiments, second substrate 106 includes silicon, glass, ceramic or other suitable materials. In some embodiments, second substrate 106 is a MEMS substrate and includes a MEMS device or a MEMS component. In some embodiments, second substrate 106 has a thickness smaller than about 200 um. In some embodiments, second substrate 106 has a thickness smaller than about 100 um. In some embodiments, second substrate 106 has a thickness smaller than about 50 um.

In some embodiments, a first via 107 is disposed within second substrate 106. First via 107 extends through second substrate 106 and couples with at least a portion of a conductive structure 103 over first substrate 101. In some embodiments, first via 107 includes conductive material, such as gold, silver, copper, nickel, tungsten, aluminum, tin and/or alloys thereof.

Third substrate 108 is disposed over second substrate 106. In some embodiments, third substrate 108 is vertically stacked over second substrate 106 or first substrate 101. In some embodiments, third substrate 108 includes silicon or other suitable materials.

A second via 109 is disposed within third substrate 108. In some embodiments, second via 109 passes through third substrate 108 and electrically connects with first via 107 and conductive structure 103. Third substrate 108 is communicable with second substrate 106 or first substrate 101 through second via 109 and first via 107. In some embodiments, second via 109 is a through substrate via (TSV) or a through silicon via (TSV). In some embodiments, the second via 109 includes conductive material, metallic material or semiconductive material. In some embodiments, second via 109 includes gold, silver, copper, nickel, tungsten, aluminum, tin and/or alloys thereof. In some embodiments, second via 109 is a copper pillar or a silicon pillar.

The first, second, and third substrates may be manufactured separately and then integrated into a stacked structure, as in FIG. 1, through bonding. As aforementioned, second substrate 106, which includes MEMS devices, is thinner than a certain value such that integration handling operations are challenging. The following operations illustrate a manufacturing method of thinning down a MEMS substrate in a wafer level or singulation operation.

Figure 2A:
FIGS. 2A-16 are schematic views of manufacturing a semiconductor structure in accordance with some embodiments of the present disclosure.

Referring to FIG. 2A, a wafer 120 is provided. In some embodiments, wafer 120 includes semiconductive material such as silicon, germanium, binary compounds, elements in between Groups III and V, such as gallium arsenide, Groups II and VI, Groups IV and VI, and between different elements in Group IV, e.g. silicon carbide. In some embodiments, wafer 120 includes semiconductive material, such as ternary compounds. Wafer 120 has a thickness greater than about 500 um. In some embodiments, wafer 120 has a thickness greater than about 750 um.

Figure 2B:
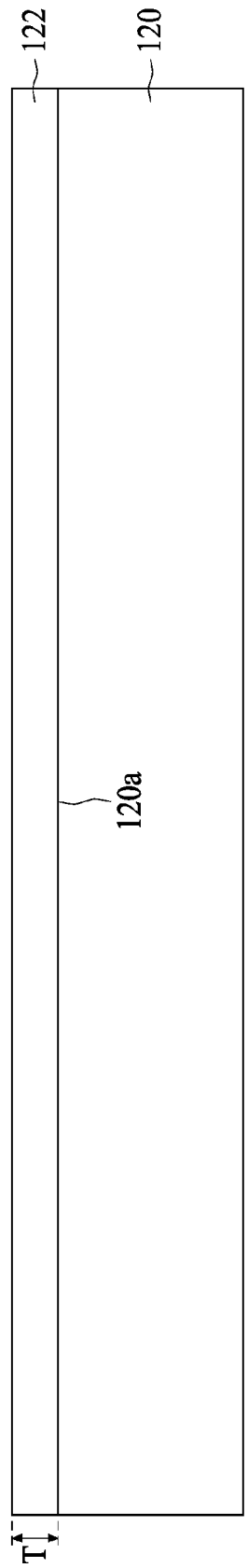
Figure 2C:
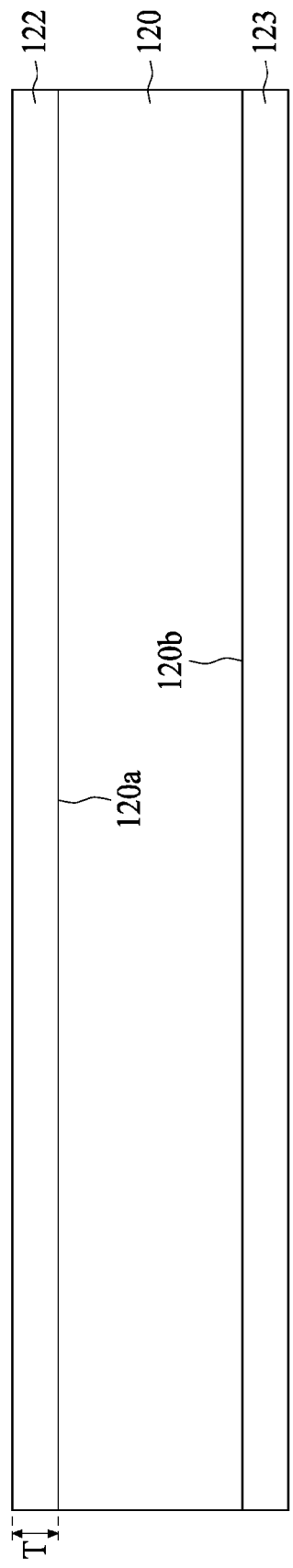

Referring to FIG. 2B, a poly silicon 122 is optionally disposed over a surface 120a of wafer 120. Poly silicon 122 has a thickness "T" extending vertically from a surface 120a. The value of "T" is determined by various factors and some of the factors will be discussed in the description later on. The following several paragraphs will present two different embodiments in parallel; one embodiment, which is illustrated in FIGS. 3B, 4B through 7B, is based on wafer 120 having optional poly silicon 122 disposed thereon; and another embodiment, illustrated in FIGS. 3A, 4A through 7A, is based on only a bare wafer 120. In some embodiments, bare wafer 120 includes single crystal silicon. In some embodiments, another poly silicon 123 is disposed over a surface 120b of wafer 120, as shown in FIG. 2C. Surface 120b is opposite to surface 120a. Poly silicon 120 or 123 can be formed by vapor deposition. As used herein, "vapor deposition" refers to a process of depositing materials on a substrate though the vapor phase. Vapor deposition processes include any process such as, but not limited to, chemical vapor deposition (CVD) and physical vapor deposition (PVD). Examples of vapor deposition methods include hot filament CVD, rf-CVD, laser CVD (LCVD), conformal diamond coating processes, metal-organic CVD (MOCVD), sputtering, thermal evaporation PVD, ionized metal PVD (IMPVD), electron beam PVD (EBPVD), reactive PVD, atomic layer deposition (ALD), plasma-enhanced CVD (PECVD), high density plasma CVD (HDPCVD), low-pressure CVD (LPCVD) and the like.

Figure 3A:
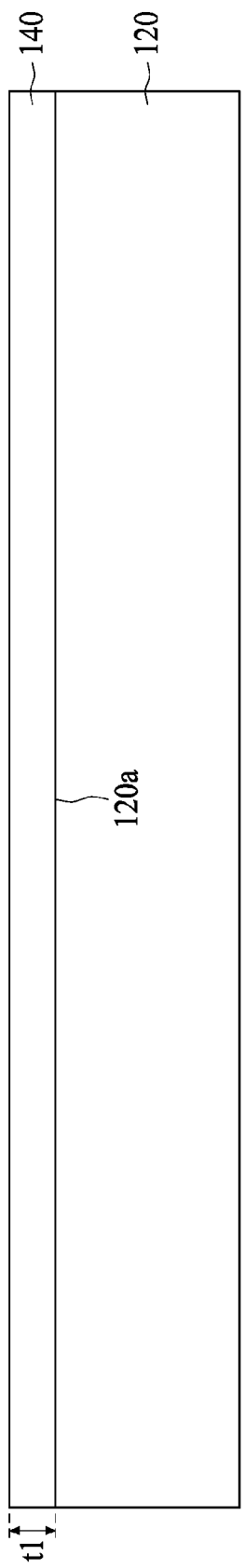

In FIG. 3A, a layer 140 is disposed over surface 120a and layer 140 is directly in contact with wafer 120. Layer 140 is configured to be suitable for forming a eutectic bond with an electrically conductive element, such as a metallic element. In the embodiment, layer 140 is composed of an element of Group IV and Ge will be used an example in the following operations. However, other suitable elements should also be appreciated. Layer 140 has a thickness "t1" extending vertically from surface 120a. Similar to thickness "T", a magnitude of "t1" is determined by various factors and some of the factors will be discussed in the description later on.

Figure 3B:
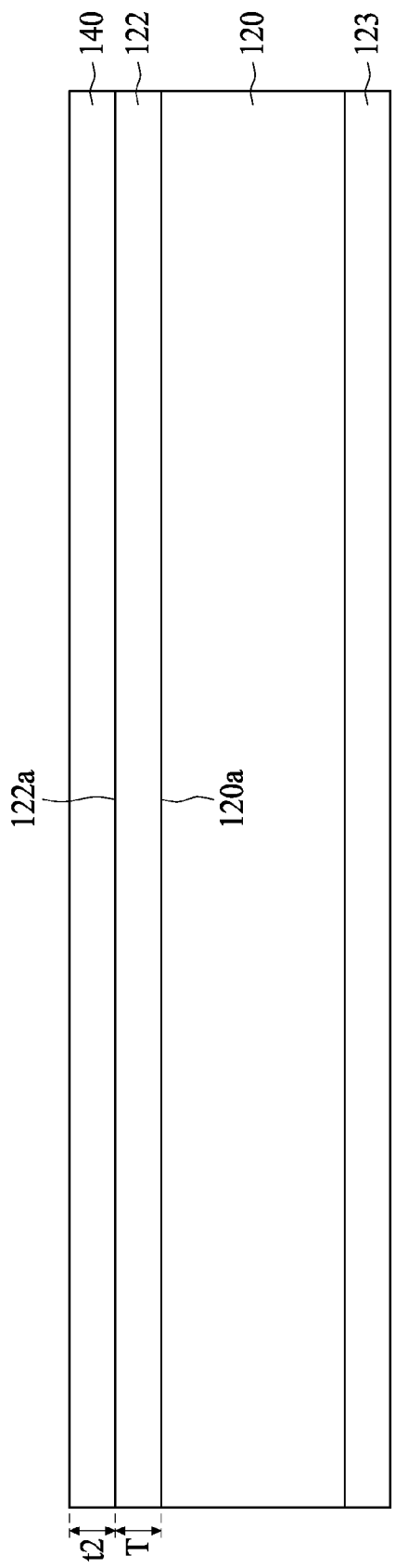

In FIG. 3B, layer 140 is disposed over surface 122a and layer 140 is directly in contact with poly silicon 122. Layer 140 has a thickness "t2" extending vertically from surface 122a. In some embodiments, t2 is less than about one tenth (1/10) of T. In some embodiments, t2 is less than about one fifth (1/5) of T. Similar to thickness "0", a magnitude of "t2" is determined by various factors and some of the factors will be discussed in the description later on.

Layer 140 can be formed by vapor deposition. Vapor deposition processes include any process such as, but not limited to, CVD and PVD. Examples of vapor deposition methods include hot filament CVD, rf-CVD, LCVD, conformal diamond coating processes, MOCVD, sputtering, thermal evaporation PVD, IMPVD, EBPVD, reactive PVD, ALD, PECVD, HDPCVD, LPCVD, and the like.

Figure 4A:
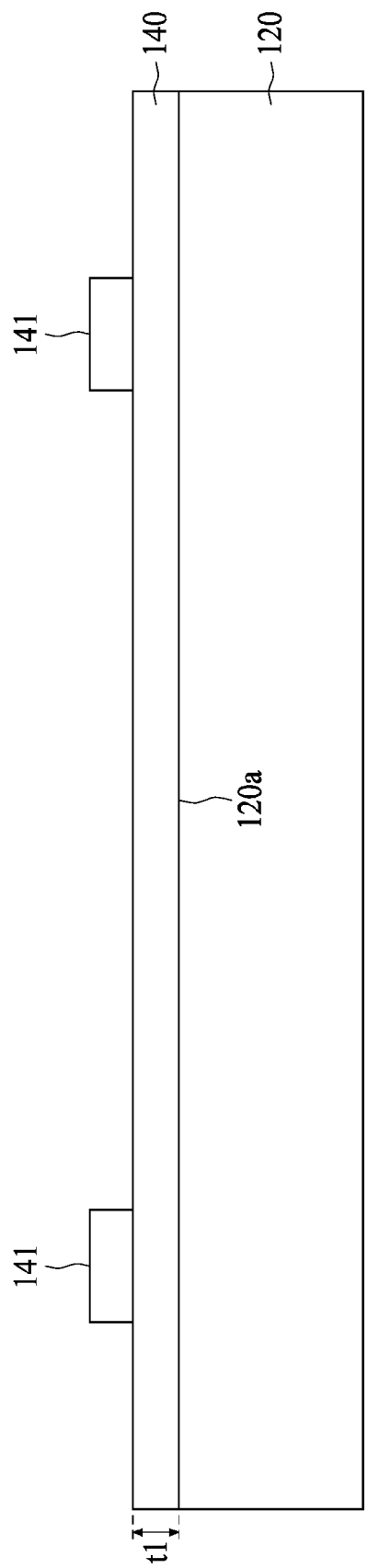
Figure 4B:
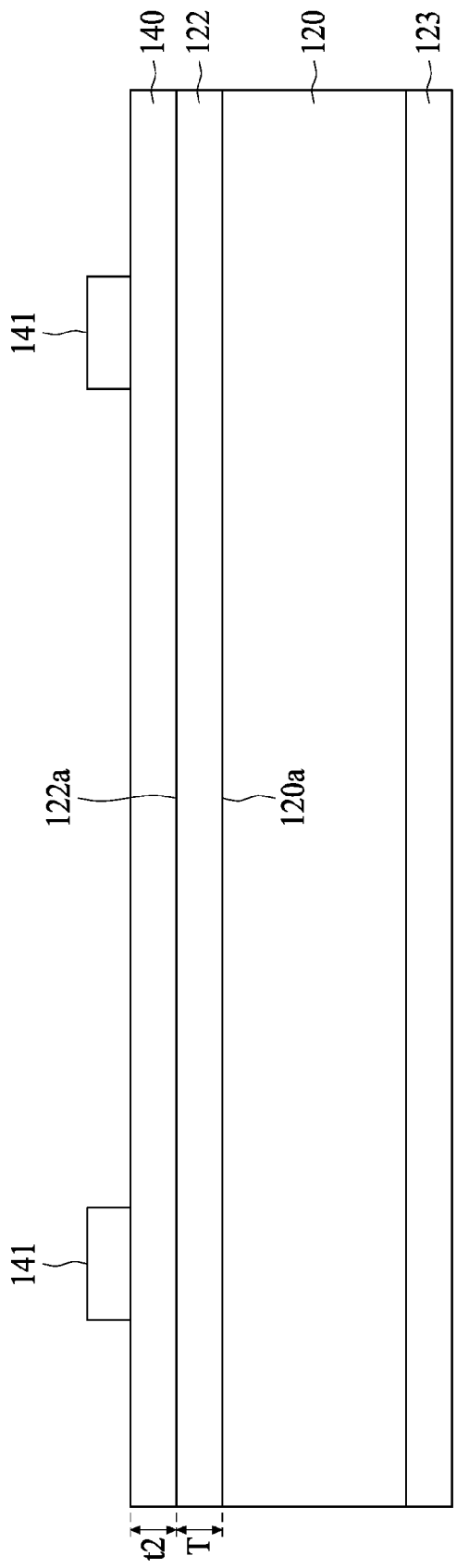

Referring to FIGS. 4A and 4B, a photo resist is disposed over layer 140 and patterned into several masks 141 over layer 140. A portion of layer 140 is uncovered. An etch operation is introduced to partially remove layer 140. The uncovered portion of layer 140 is removed during the etch operation. The etch operation includes isotropic or an-isotropic etch and may use etchants such as fluorine, chlorine, etc. After the etch operation, patterned masks 141 (remaining photo resist) are removed from layer 140. The remaining unetched portion of layer 140 is left.

Figure 5A:
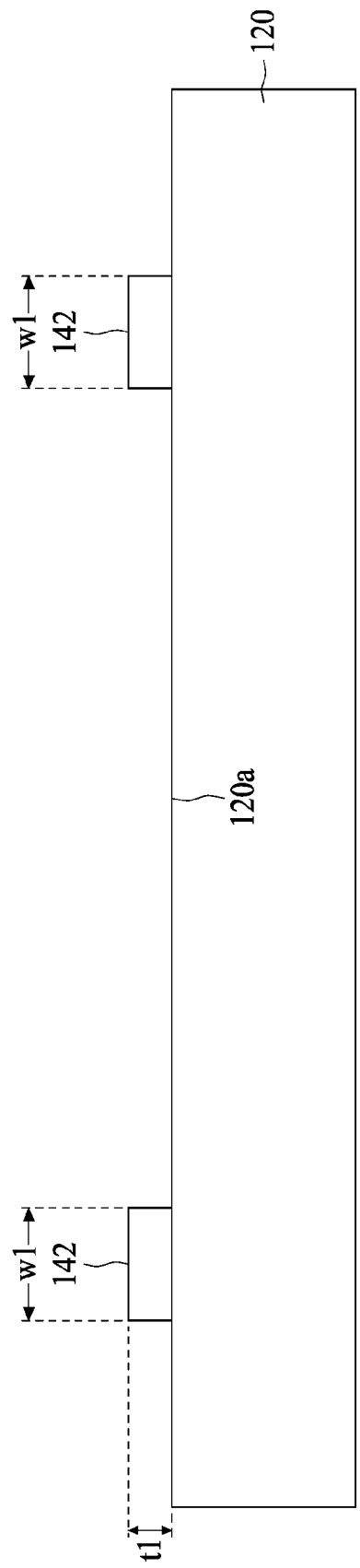

Referring to FIG. 5A, after patterned masks 141 are removed, several mesas 142 are formed on surface 120a. Each mesa 142 has a width w1 measured horizontally along surface 120a. Presuming the etch loss during the etching operation for layer 140 and removal of patterned masks 141 is relatively small compared to the disposed thickness t1 of layer 140, the thickness of mesa 142 is substantially equal to the disposed thickness, t1.

Figure 5B:
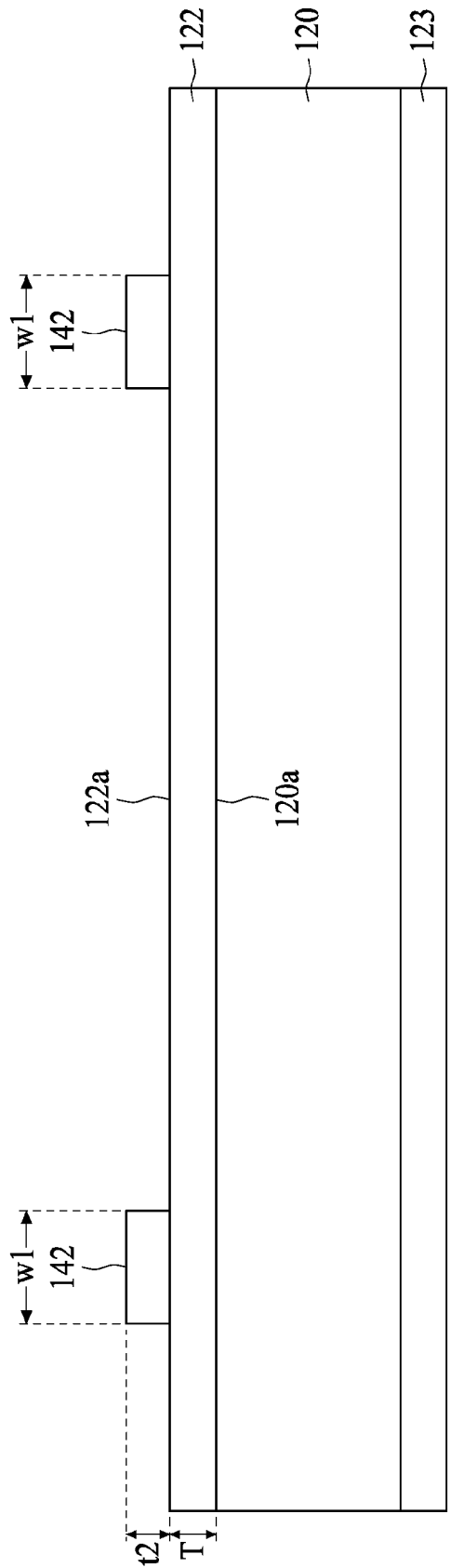

Referring to FIG. 5B, after patterned masks 141 are removed, several mesas 142 are formed on surface 122a. Each mesa 142 has a width w1 measured horizontally along surface 120a. Presuming the etch loss during the etching operation for layer 140 and removal of patterned masks 141 is relatively small compared to the as disposed thickness of layer 140, the thickness of mesa 142 is substantially equal to the disposed thickness, t2.

Figure 6A:
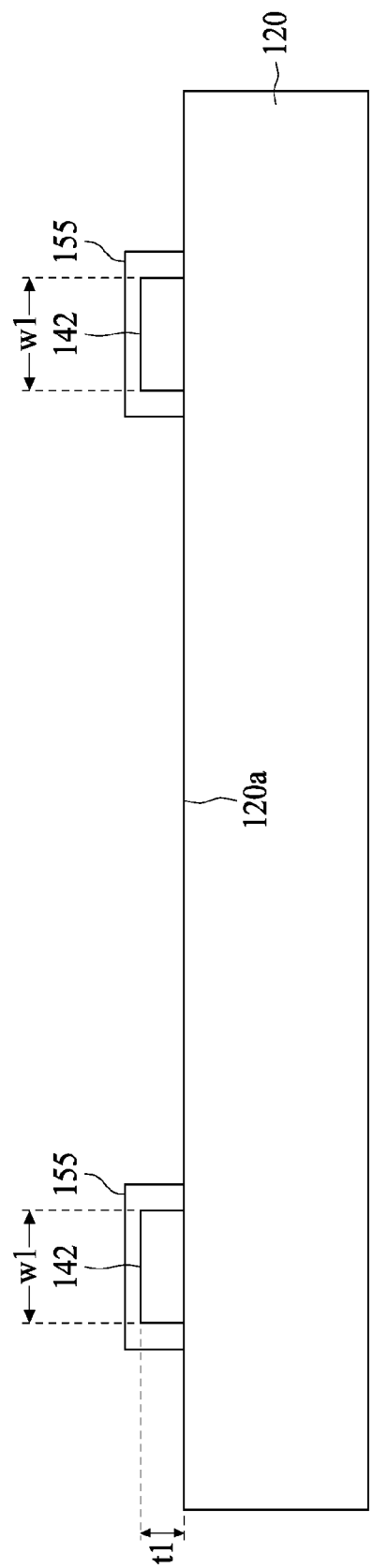
Figure 6B:
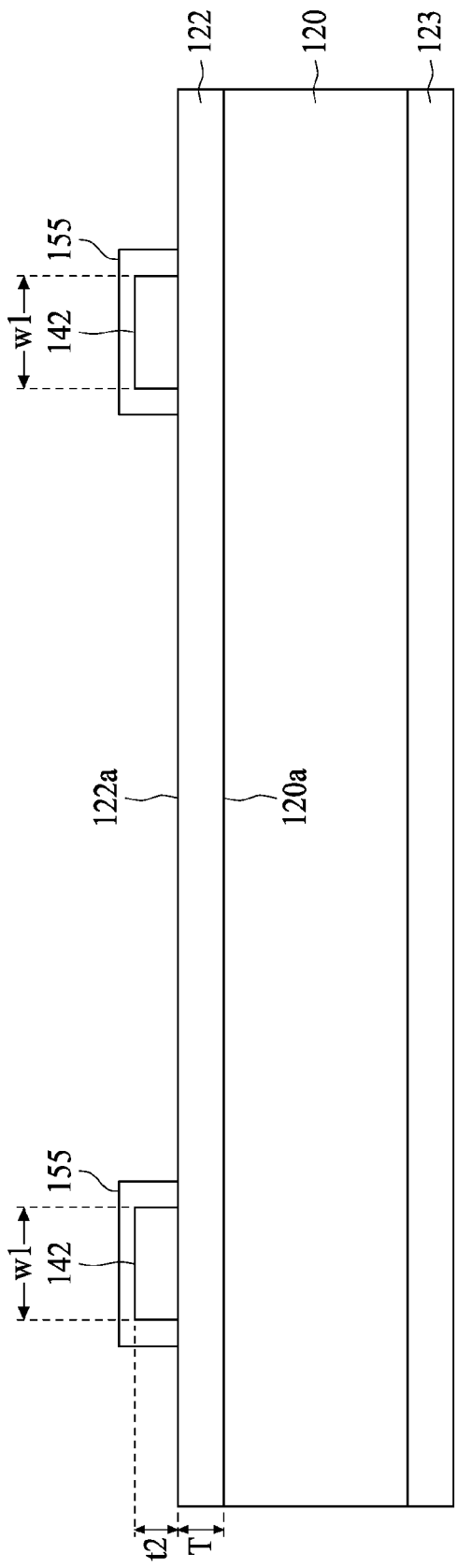

Referring to FIG. 6A, a photo resist is disposed to cover mesas 142 and patterned into several masks 155. Masks 155 also cover a portion of surface 120a. A portion of surface 120a that is around mesas 142 is uncovered by masks 155. Similarly, in FIG. 6B, a photo resist is disposed to cover mesas 142 and patterned into several masks 155. Masks 155 also cover a portion of surface 122a and a portion of surface 122a around each mesa 142 is exposed from masks 155.

Then, an etch operation is introduced to remove the uncovered portion of layer 120 or 122. The etch operation includes isotropic or an-isotropic etch and may use etchants such as fluorine, chlorine, etc. After the etch operation is completed, patterned masks 155 are removed.

Figure 7A:
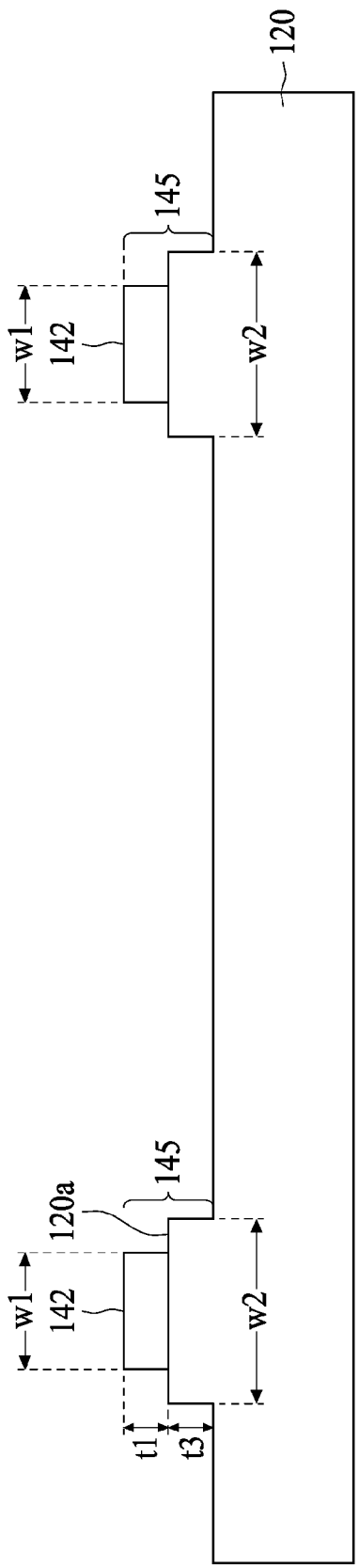

Referring to FIG. 7A, after patterned masks 155 are removed, several new mesas 145 are formed. Original surface 120a under new mesa 145 is reserved but substrate 120 around new mesa 145 is recessed to be lower than original surface 120a by a thickness t3. In some embodiments, thickness t3 is between about 1 um and 5 um. In some embodiments, thickness t3 is between about 1 um and 10 um. Similar to thickness "T", a magnitude of "t3" is determined by various factors and some of the factors will be discussed in the description later on. In some embodiments, t3 is substantially equal to t1.

Figure 7B:
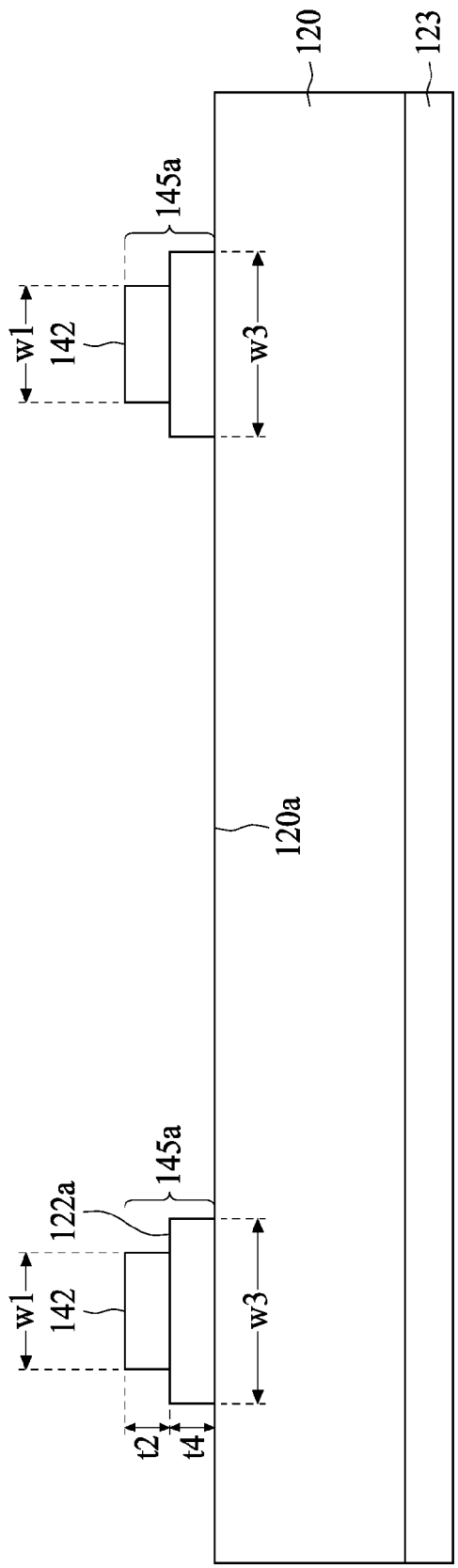

Referring to FIG. 7B, after patterned masks 155 are removed, several new mesas 145a are formed. Original surface 122a is partially reserved at new mesa 145a but poly silicon 122 around new mesa 145a is recessed to be lower than original surface 122a by a thickness t4. In some embodiments, thickness t4 is between about 1 um and 5 um. In some embodiments, thickness t4 is between about 1 um and 10 um. Similar to thickness "T", a magnitude of "t4" is determined by various factors and some of the factors will be discussed in the description later on. In some embodiments, t4 is substantially equal to T.

In some embodiments, both new mesa 145 and new mesa 145a are in a stepped configuration as shown in FIGS. 7A and 7B. New mesa 145 is a two-leveled structure. A first level of new mesa 145 is under mesa 142 and formed by an extruded substrate portion. A second level is original mesa 142. New mesa 145 has a bottom width w2 at the first level, which is wider than width w1 of mesa 142. New mesa 145a is also a two-leveled structure. A first level of new mesa 145a is under mesa 142 and formed by an extruded poly silicon portion. A second level of new mesa 145a is original mesa 142. New mesa 145a has a bottom width w3 at the first level, which is wider than width w1 of mesa 142.

Embodiments like FIG. 7A and FIG. 7B have a thickness of at least 500 um. In some embodiments, the thickness is between about 400 um and about 700 um. In some embodiments, the thickness is between about 450 um and about 750 um. In some embodiments, the thickness is between about 500 um and about 700 um. In some embodiments, the thickness is between about 500 um and about 750 um. In some embodiments, the thickness is between about 450 um and about 800 um.

Figure 8:
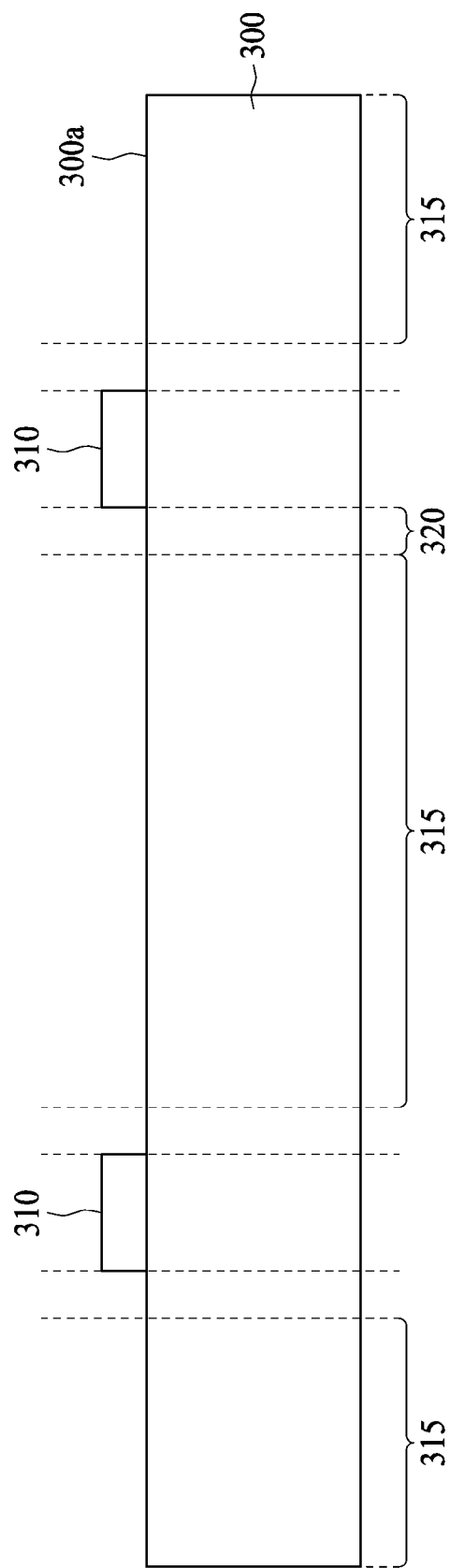

Referring to FIG. 8, a semiconductive substrate 300 is provided. Substrate 300 includes semiconductive material such as silicon, germanium, binary compounds, elements in between Groups III and V, such as gallium arsenide, Groups II and VI, Groups IV and VI, and between different elements in Group IV, e.g. silicon carbide. In some embodiments, substrate 300 includes semiconductive material, such as ternary compounds. In some embodiments, substrate 300 is a wafer and includes several dies containing MEMS devices. The dimension of substrate 300 is corresponding to the size of wafer 120. For example, wafer 120 may be a 12-inch wafer and substrate 300 also has a diameter of around 12 inches. Furthermore, substrate 300 also includes several pads 310 extruded upwardly from a surface 300a of substrate 300. In some embodiments, pads 310 include metal or alloy such as gold, silver, copper, aluminum, zinc, other suitable conductive materials, and/or combinations thereof. In some embodiments, pads 310 include titanium. In some embodiments, pads 310 include aluminum copper alloy. Between adjacent pads 310 is a cell that is configured to have a die area 315 for receiving a device. A dummy zone 320 is between die area 315 and each pad 310. Dummy zone 320 is a sacrificial region configured as a scribe line for singulation.

Figure 9:
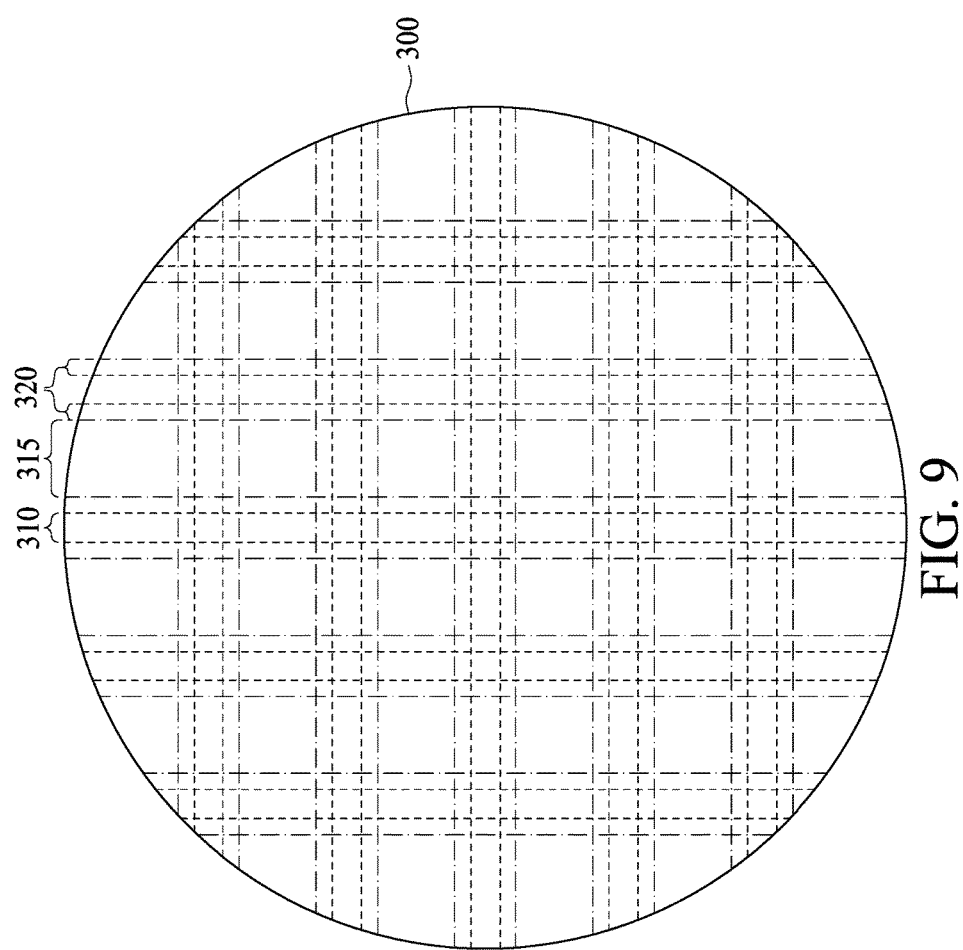

FIG. 9 is a top view of FIG. 8, showing surface 300a of substrate 300 which is configured into an array pattern and includes several cells. Each cell has at least two dummy zones 320. In some embodiments, dummy zone 320 has a width between about 1 um and about 200 um. In some embodiments, dummy zone 320 has a width between about 20 um and about 200 um. In some embodiments, dummy zone 320 has a width between about 50 um and about 200 um. In some embodiments, dummy zone 320 has a width between about 100 um and about 200 um.

Figure 10:
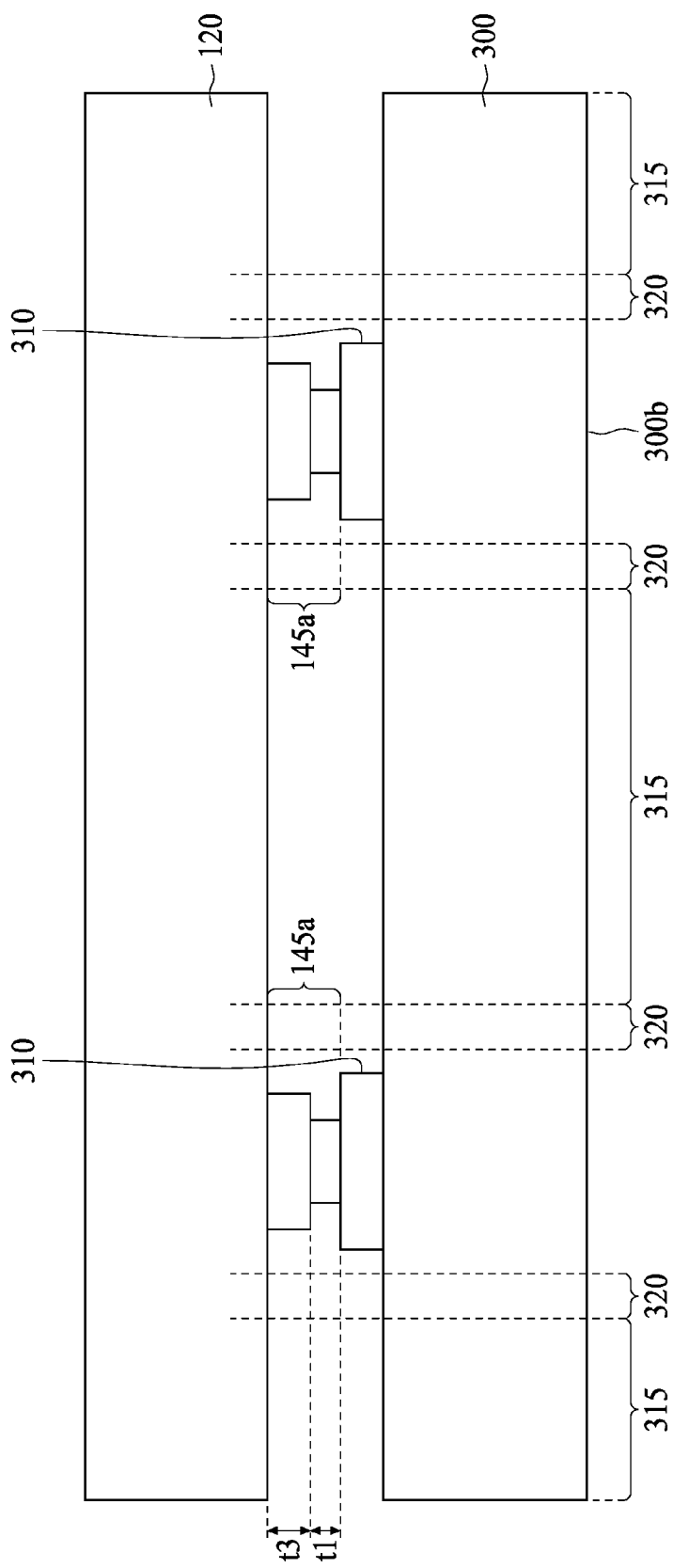

Referring to FIG. 10, wafer 120 in FIG. 7A or 7B is flipped and bonded with substrate 300. Each new mesa 145 or 145a is aligned with a corresponding pad 310 on substrate 300. Pad 310 is electrically conductive. As aforementioned, because mesa 142 can be eutectically bonded with a metal pad 310, wafer 120 is bonded with substrate 300 through new mesa 145 or 145a. A gap between wafer 120 and substrate 300 is determined by thickness t1 of mesa 142, thickness t3, and thickness of pad 310. As thicknesses t1 and t3 become greater, the gap is also enlarged. A larger gap can help accommodate more structures extruded from surface 300a. More design rooms are provided for the MEMS device. However, for some embodiments, the bonded wafer and substrate structure may experience a greater torque during a following grinding operation; the gap should be controlled within a predetermined value. Same factors also apply to embodiment as shown in FIG. 7B, because magnitude of t2, t4, and thickness of pad 310 decide the gap between the bonded wafer and substrate.

In some embodiments, thickness T is between about 1 um and about 10 um. In some embodiments, thickness t1 or t2 is between about 0.1 um and about 1 um. In some embodiments, thickness t1 or t2 is between about 0.3 um and about 1 um. In some embodiments, thickness t1 or t2 is between about 0.5 um and about 1 um. In some embodiments, thickness t1 or t2 is between about 0.3 um and about 0.8 um.

In some embodiments, thickness t3 is between about 1 um and about 10 um. In some embodiments, thickness t3 is between about 3 um and about 10 um. In some embodiments, thickness t3 is between about 3 um and about 8 um. In some embodiments, thickness t4 is between about 1 um and about 10 um. In some embodiments, thickness t4 is between about 3 um and about 10 um. In some embodiments, thickness t4 is between about 3 um and about 8 um.

Figure 11:
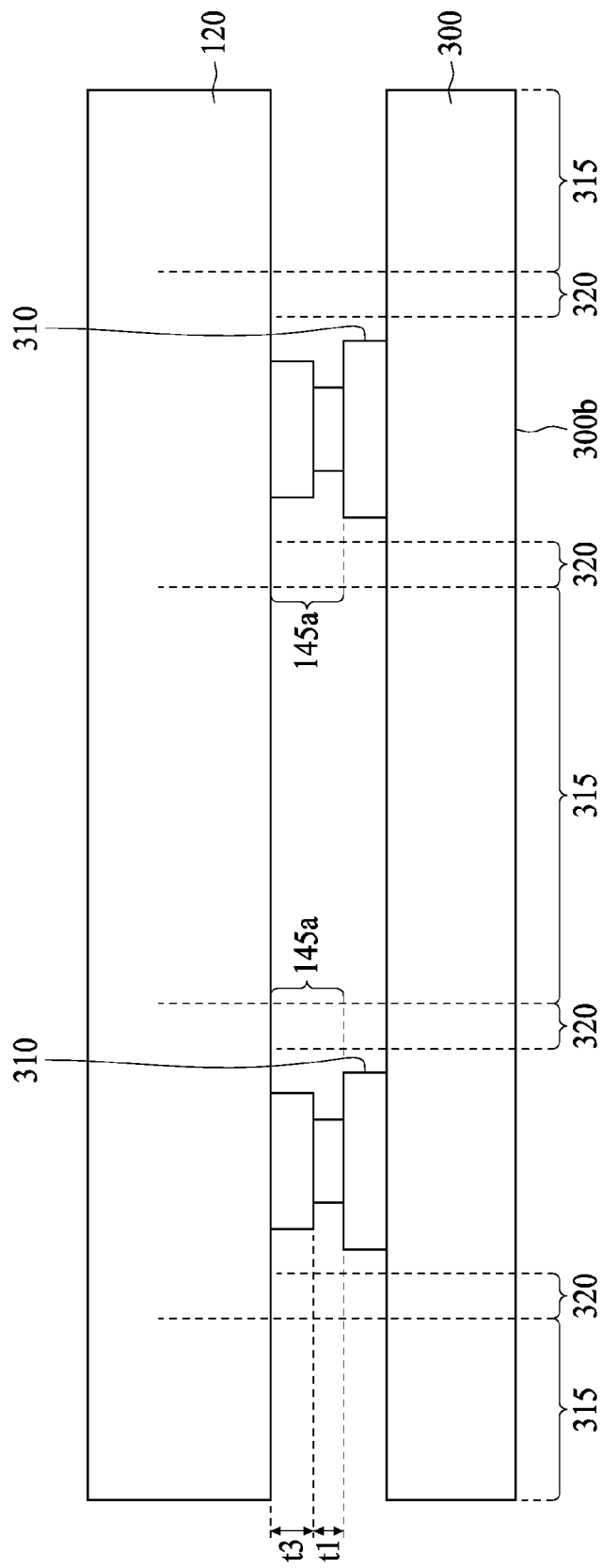

Referring to FIG. 11, the bonded wafer and substrate structure is ground from a surface 300b of substrate 300 to be less than a predetermined value. Because wafer 120 is a carrier, which has thickness at least over about 500 um, the bonded substrate and wafer structure has sufficient rigidity during the grinding operations while substrate 300 is thinned down to be below a very thin thickness. In some embodiments, substrate 300 is ground down to a thickness of less than about 400 um. In some embodiments, substrate 300 is ground down to a thickness of less than about 150 um. In some embodiments, substrate 300 is ground down to a thickness of less than about 100 um. In some embodiments, substrate 300 is ground down to a thickness of less than about 550 um. In some embodiments, substrate 300 is thinned down to a thickness which is thinner than a thickness of wafer 120

Figure 12:
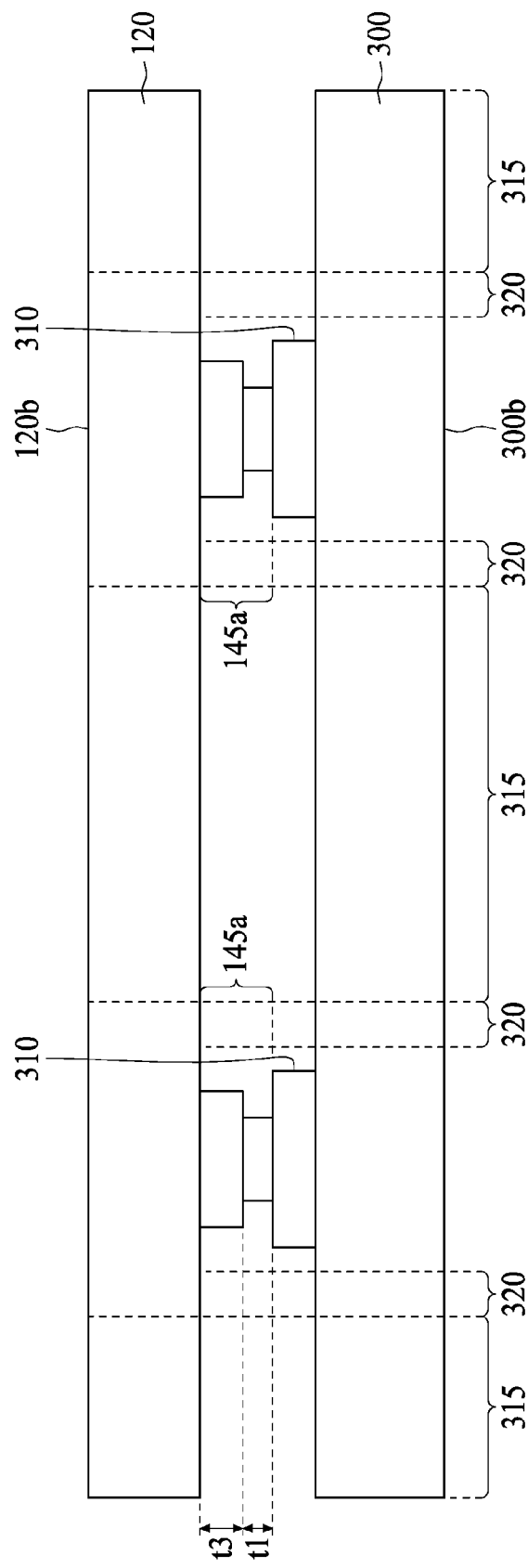

An optional operation can be introduced to thin down wafer 120 from surface 120b. As shown in FIG. 12, wafer 120 is thinned down to be under about 500 um. In some embodiments, wafer 120 is thinned down to be under about 100 um.

Figure 13:
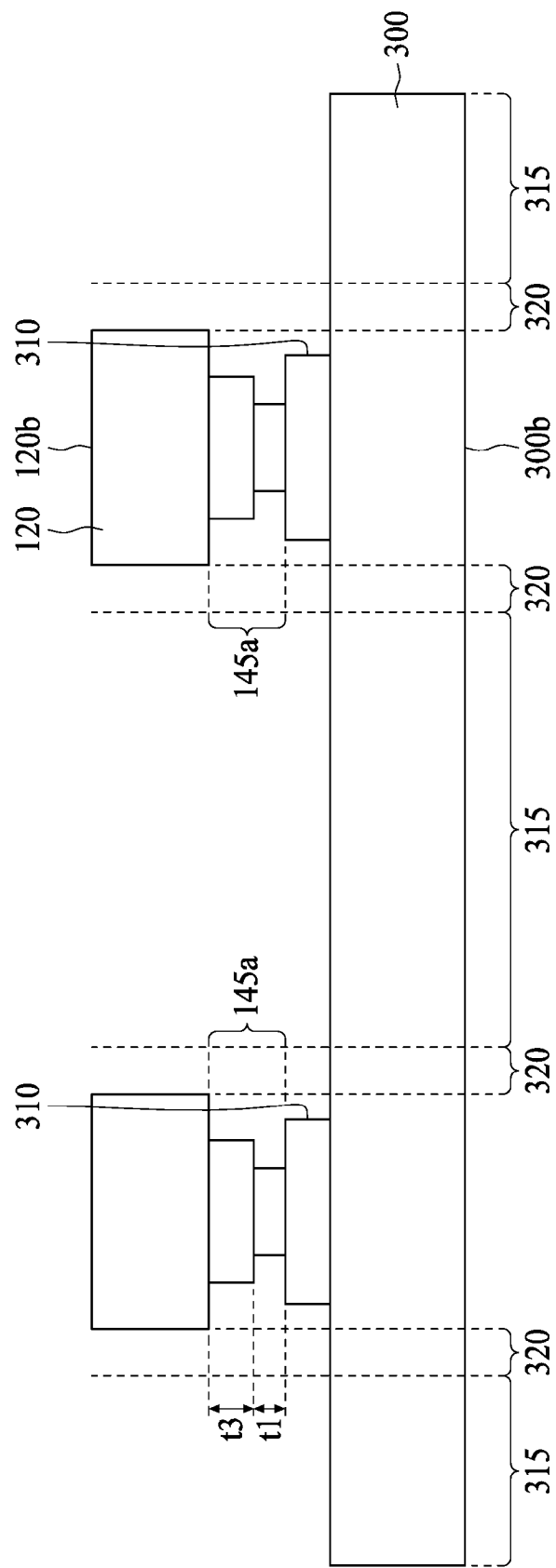

Referring to FIG. 13, a portion of wafer 120 is removed, thereby exposing die area 315 and dummy zone 320. The removal operation can be performed by etch, laser scribing or other suitable processes. In some embodiments, a photo resist is disposed on surface 120b and patterned into several masks. Each mask is substantially aligned with a corresponding bonded region. An etch is introduced to remove the uncovered regions and forms several islands over substrate 300 and expose die area 315 and dummy zone 320. Each island is a eutectic bonded site.

Figure 14:
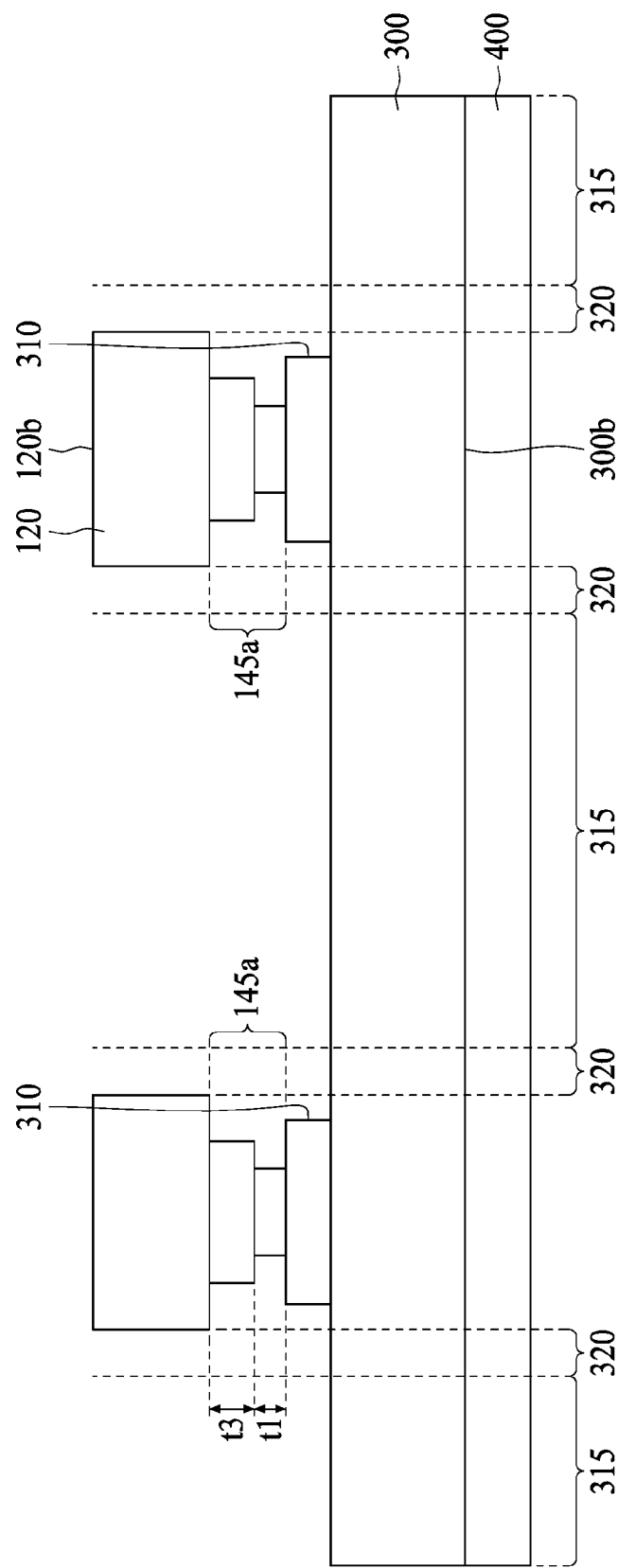

Referring to FIG. 14, a film 400 is attached on surface 300b. Film 400 can be made with an elastic material and can be deformed while receiving a force. In some embodiments, film 400 is a dry film. In some embodiments, film 400 is a UV curable film.

Figure 15:
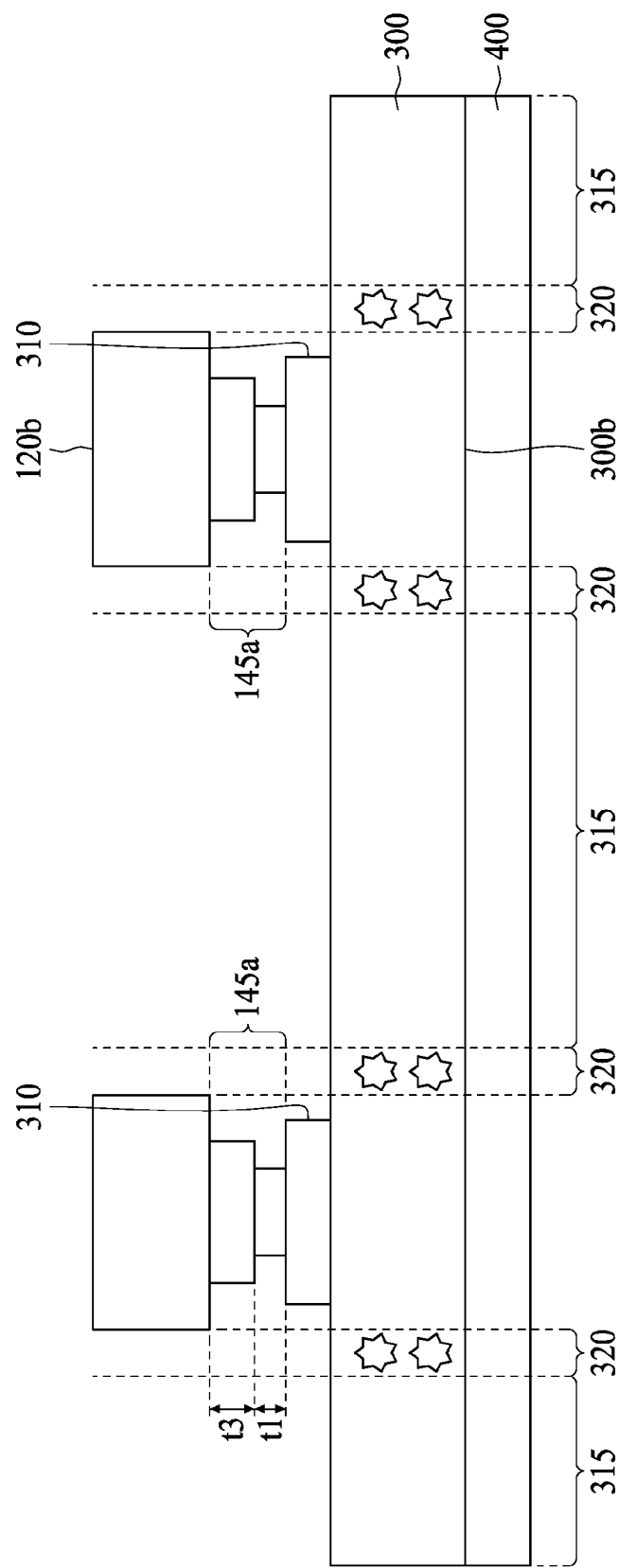

Referring to FIG. 15, a scribing operation is performed at dummy zone 320. In some embodiments, the scribing operation is performed by a blade saw. In some embodiments, the scribing operation is performed by a laser.

Figure 16:
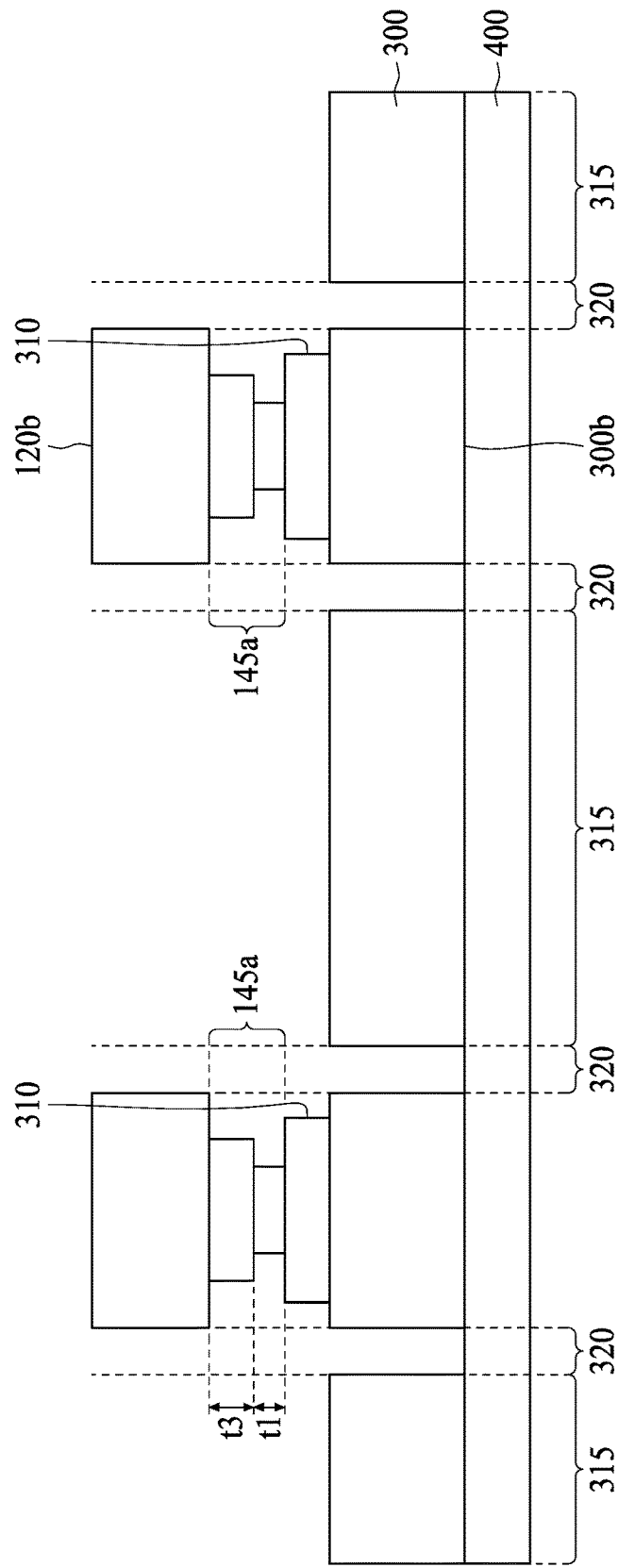

Referring to FIG. 16, after the scribing operation goes through substrate 300 and separates substrate 300 into several individual dies, film 400 can be further deformed and the space between adjacent dies is increased. The singulated die can be picked and placed on a stage for packaging. In some embodiments, substrate 300 is corresponding to second substrate 106 in FIG. 1 and can be further integrated with other devices into a three-dimensional semiconductor device.

A semiconductor manufacturing method includes providing a wafer and forming a layer over a surface of the wafer, where the layer is able to form a eutectic layer with a conductive element. The layer is partially removed to form a plurality of mesas and the wafer is bonded to a substrate through the plurality of mesas. The substrate is thinned down to a thickness so as to be less than a predetermined value.

A semiconductor manufacturing method includes providing a wafer and forming a stepped configured mesa over a surface of the wafer. The stepped configured mesa comprises a first level over the surface. The stepped configured mesa also comprises a second level on the first level and is more distal to the surface. The first level comprises a width greater than a width of the second level, and the second level comprises an element configured to form a eutectic bond with a conductive element.

A semiconductor manufacturing method includes providing a substrate comprising a plurality of cells arranged in an array pattern. Each cell comprises at least two dummy zones and a die area between the two dummy zones. Each dummy zone is configured as a to-be-scribed region. The method also includes eutectically bonding a wafer to the substrate. The method further includes thinning down the substrate to a thickness which is thinner than a thickness of the wafer and partially removing the wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor manufacturing method, comprising:
providing a wafer;
forming a layer over a surface of the wafer, wherein the layer is able to form a eutectic layer with a conductive element;
partially removing the layer to form a plurality of mesas;
bonding the wafer to a substrate through the plurality of mesas, the substrate comprising a die area misaligned with the plurality of bonded mesas;
thinning down a thickness of the substrate subsequent to bonding the wafer with the substrate so as to be less than a predetermined value; and
singulating through the bonded wafer-substrate structure to form individual dies that separate the die area from the plurality of bonded mesas.

2. The method of claim 1, further comprising forming a poly silicon between the surface and the layer.

3. The method of claim 1, wherein the layer comprises an element of Group IV.

4. The method of claim 1, wherein the predetermined value is 550 um.

5. The method of claim 1, further comprising partially removing the surface to thereby form a plurality of stepped configured mesas, wherein each of the stepped configured mesas is corresponding to one of the plurality of mesas.

6. The method of claim 1, wherein the bonding the wafer to a substrate through the plurality of mesas further comprises bonding each of the plurality of mesas to a corresponding conductive pad on the substrate.

7. The method of claim 1, further comprising removing a portion of the wafer to thereby expose the die area of the substrate.

8. The method of claim 1, further comprising exposing a dummy zone on the substrate through removing a portion of the wafer.

9. The method of claim 8, wherein the singulating the bonded wafer-substrate structure comprises singulating the substrate through the dummy zone.

10. A semiconductor manufacturing method, comprising:
providing a wafer;
forming a stepped configured mesa over a surface of the wafer, wherein the stepped configured mesa comprises:
a first level over the surface; and
a second level on the first level, the second level being more distal to the surface, wherein the first level comprises a width greater than a width of the second level, and the second level comprises an element configured to form a eutectic bond with a conductive element;
bonding the wafer with a substrate through the stepped configured mesa to form a bonded site including the stepped configured mesa;
thinning the substrate subsequent to bonding the wafer with the substrate; and
forming a mask on a surface of the wafer opposite the substrate and substantially aligned with the bonded site.

11. The method of claim 10, wherein the bonding the wafer with a substrate comprises bonding the wafer to the substrate through the stepped configured mesa.

12. The method of claim 10, wherein the substrate comprises a MEMS device.

13. The method of claim 10, wherein the substrate comprises a conductive pad and the conductive pad is aligned with the configured mesa.

14. The method of claim 13, wherein the second level comprises an element of Group IV and the conductive pad comprises aluminum.

15. The method of claim 10, wherein the thinning the substrate subsequent to bonding the wafer with the substrate comprises thinning down the substrate to be less than a predetermined thickness.

16. The method of claim 15, wherein the predetermined thickness is 100 um.

17. The method of claim 10, wherein the first level is poly silicon or silicon.

18. A semiconductor manufacturing method, comprising:
providing a substrate comprising a plurality of pads and a plurality of cells disposed between the plurality of pads and arranged in an array pattern, wherein each cell comprises:
at least two dummy zones;
a die area between the two dummy zones, wherein each dummy zone is configured as a to-be-scribed region;
eutectically bonding a wafer to the substrate through the plurality of pads to form a plurality of bonded sites;
thinning down the substrate, subsequent to bonding the wafer to the substrate, to a thickness which is thinner than a thickness of the wafer;
partially removing the wafer to expose the dummy zones of the substrate; and
performing a singulation operation at the exposed dummy zones of the substrate to separate each of the plurality of cells from the plurality of bonded sites to form individual dies.

19. The method of claim 18, wherein the partially removing the wafer comprises exposing the dummy zones and die area from the wafer.

20. The method of claim 18, further comprising forming a mesa on a surface of the wafer.

* * * * *